(12) United States Patent
Ha et al.

(10) Patent No.: US 7,619,492 B2
(45) Date of Patent: Nov. 17, 2009

(54) FILM BULK ACOUSTIC RESONATOR AND A METHOD FOR MANUFACTURING THE SAME

(75) Inventors: Byeoung-ju Ha, Yongin-si (KR); Seog-woo Hong, Yongin-si (KR); In-sang Song, Gwanak-gu (KR); Hyung Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 348 days.

(21) Appl. No.: 11/324,303

(22) Filed: Jan. 4, 2006

(65) Prior Publication Data

US 2006/0170520 A1    Aug. 3, 2006

(30) Foreign Application Priority Data

Jan. 31, 2005    (KR) .................. 10-2005-0008706

(51) Int. Cl.
*H03H 9/54* (2006.01)
*H01L 41/22* (2006.01)

(52) U.S. Cl. ..................... 333/187; 29/25.35

(58) Field of Classification Search ............... 333/187; 216/2; 29/25.35
See application file for complete search history.

(56) References Cited

U.S. PATENT DOCUMENTS

| | | | |
|---|---|---|---|
| 4,456,850 A * | 6/1984 | Inoue et al. ............. 310/324 |
| 5,160,870 A * | 11/1992 | Carson et al. ............ 310/339 |
| 6,734,763 B2 * | 5/2004 | Nishihara et al. ......... 333/187 |
| 6,767,749 B2 * | 7/2004 | Kub et al. ............... 438/3 |
| 6,924,717 B2 * | 8/2005 | Ginsburg et al. ......... 333/187 |
| 7,187,253 B2 * | 3/2007 | Sano et al. .............. 333/187 |
| 2003/0107456 A1 | 6/2003 | Nishihara et al. |
| 2004/0135144 A1 | 7/2004 | Yamada et al. |
| 2004/0211749 A1 * | 10/2004 | Grynkewich et al. ....... 216/2 |

FOREIGN PATENT DOCUMENTS

| | | |
|---|---|---|
| EP | 1 306 973 A2 | 5/2003 |
| EP | 1 542 362 A1 | 6/2005 |
| JP | 2000-91663 | 3/2000 |
| JP | 2000357931 A | 12/2000 |
| JP | 2002344280 A | 11/2002 |
| JP | 2003204239 A | 7/2003 |
| JP | 2004007352 A | 1/2004 |
| KR | 2001-0066811 | 7/2001 |
| WO | WO 2004/001964 A1 | 12/2003 |

* cited by examiner

*Primary Examiner*—Benny Lee
*Assistant Examiner*—Alan Wong
(74) *Attorney, Agent, or Firm*—Sughrue Mion, PLLC

(57) ABSTRACT

A film bulk acoustic resonator (FBAR) including a substrate having an etched air gap therethrough; a resonance part having a first electrode, a piezoelectric film and a second electrode which are laminated in turn above the air gap; and an etching resistance layer disposed between the air gap and the resonance part to limit an etching depth in forming the air gap, thereby preventing damage to the resonance part.

20 Claims, 5 Drawing Sheets

FILM BULK ACOUSTIC RESONATOR AND A METHOD FOR MANUFACTURING THE SAME

CROSS-REFERENCE TO RELATED PATENT APPLICATION

This application claims benefit under 35 U.S.C. § 119 from Korean Patent Application No. 2005-8706, filed on Jan. 31, 2005, the entire content of which is incorporated herein by reference.

BACKGROUND OF THE INVENTION

1. Field of the Invention

The present invention relates to a film bulk acoustic resonator (FBAR) and a method for manufacturing the same.

2. Description of the Related Art

As mobile communication apparatuses such as a mobile telephone are rapidly becoming more popular, there is an increased demand for a miniature light-weight filter for use therein.

In this regard, a film bulk acoustic resonator (FBAR) is known as a means suitable for implementing the miniature light-weight filter, and it is possible to make the FBAR in large quantities with minimum cost. In addition, it is possible to achieve a high quality factor which is a primary characteristic of the filter. Also, the FBAR can be used in a micro frequency band, and has an advantage of being able to operate in a PCS (Personal Communication System) and a DCS (Digital Cordless System) band.

Generally, the FBAR element is made by laminating in turn a lower electrode, a piezoelectric layer, and an upper electrode on a substrate. A principle of operation of the FBAR, is that electric energy applied to an electrode introduces an electric field varying in time in the piezoelectric layer. The electric field generates a Bulk Acoustic Wave in the same direction as a vibration direction of the resonance part in the piezoelectric layer, to produce resonance.

FIG. 1A is a cross sectional view of a bragg reflector type FBAR. Referring to FIG. 1A, the bragg reflector type FBAR comprises a substrate 10, a reflection layer 11, a lower electrode 12, a piezoelectric layer 13 and an upper electrode 14. In the bragg reflector type FBAR, an elastic wave generated in the piezoelectric layer 13 cannot be transmitted in a direction toward the substrate, and the elastic wave is entirely reflected by the reflection layer 11 to generate an effective resonance. A manufacturing process thereof comprises a step of forming the reflection layer 11 by depositing highly elastic impedance substances on the substrate 10 layer upon layer, and a step of forming a resonance part on the reflection layer 11 by stacking, in turn, the lower electrode 12, the piezoelectric layer 13 and the upper electrode 14. The bragg reflector type FBAR has a strong structure and is not subject to stress by bending. However, this type of FBAR has a disadvantage in that it is difficult to form more than four reflection layers having an exact thickness needed for full reflection. Also, much time and cost are needed for manufacturing.

Accordingly, research has been conducted relating to an air gap type FBAR, and in this type of FBAR, the substrate and the resonance part are isolated by an air gap instead of a reflection layer. FIG. 1B is a cross sectional diagram showing the structure of a conventional air gap type FBAR.

In the FBAR shown in FIG. 1B, an air gap 21 is formed under the resonance part, where the lower electrode 23, the piezoelectric layer 24 and the upper electrode 25 are laminated in turn, to separate the resonance part and the substrate 20. In a manufacturing process thereof, a sacrificial layer (not shown) is deposited on the substrate 20, and after a patterning process, the sacrificial layer remains on a predetermined area on the substrate. Next, an insulating layer 22 is deposited on the sacrificial layer and the substrate 40, and the lower electrode 23, the piezoelectric layer 24 and the upper electrode 25 are formed in turn to make the resonance part. The insulating film 22 functions as a membrane layer which supports the resonance part. Finally, the sacrificial layer is removed to form the air gap 21. In this regard, a via hole is formed which connects an exterior of the element to the sacrificial layer, and an etching liquid is injected through the hole to remove the sacrificial layer, to thereby form an air gap 21 in the place of the sacrificial layer. Meanwhile, in reference to U.S. Pat. No. 6,355,498, when the air gap type FBAR shown in FIG. 1B is manufactured, a substance which prevents etching is used to adjust the size and position of the air gap. However, the above manufacturing method requires a sacrificial layer, thereby making the manufacturing process complex. In addition, the via-hole should be formed on the membrane layer, causing a limitation in filter design. In addition, the etching process using the via-hole formed very near the resonance part may cause chemical damage to the resonator. Meanwhile, considering the problem of existing FBAR elements, an air gap type FBAR has been developed, which is made by depositing a lower electrode, a piezoelectric layer and an upper electrode on a substrate to form a resonance part and then etching a lower part of the substrate to form an air gap. However, in this type of air gap FBAR, the process of etching the lower part of the substrate may damage the resonance part, thereby deteriorating resonance characteristics.

SUMMARY OF THE INVENTION

The present invention has been developed in order to solve the above drawbacks and other problems associated with conventional FBAR designs. It is therefore an object of the present invention to provide an air gap type FBAR and a method for manufacturing the same, where the air gap can be formed by an etching process without damage to the resonance part.

The above object of the present invention has been achieved by providing a Film Bulk Acoustic Resonator which comprises a substrate having an etched air gap therethrough; a resonance part having a first electrode, a piezoelectric film and a second electrode which are laminated in turn above the air gap; and an etching resistance layer disposed between the air gap and the resonance part so as to limit an etching depth in forming the air gap, thereby preventing damage to the resonance part.

The etching resistance layer is preferably made of a metal material having a high (dry) etching selectivity (or rather high etching resistance) relative to the substrate.

The etching resistance layer is preferably made of the same material as the first electrode.

The etching resistance layer is preferably made of chrome Cr.

The etching resistance layer is preferably laminated between the first electrode and the substrate.

In addition, an insulating layer is preferably laminated between the substrate and the etching resistance layer.

The etching resistance layer is preferably made of a dielectric substance, and more preferably is made of an aluminum nitride AlN.

Preferably, the etching resistance layer is disposed so as to contact the piezoelectric film.

The above object of the present invention has also been achieved by providing a method for manufacturing a Film Bulk Acoustic Resonator, which comprises a step (a) of depositing an insulating layer on a substrate; a step (b) of laminating an etching resistance film on the insulating layer; a step (c) of laminating in turn a first electrode, a piezoelectric film and a second electrode on the etching resistance film and/or the insulating layer to make a resonance part; and a step (d) etching the substrate to form an air gap below the resonance part.

The step (b) preferably includes depositing a metal material on the insulating layer; and forming the etching resistance film on a part of the insulating layer by patterning the metal material so as to expose a portion of the insulating layer.

The step (c) preferably includes laminating the first electrode on the patterned etching resistance film; laminating the piezoelectric film on the first electrode and the exposed insulating film; and laminating the second electrode on the piezoelectric film.

Step (d) preferably comprises etching the substrate and insulating layer from a lower part of the substrate to the etching resistance film in an area below the resonance part to form said air gap.

The etching of step (d) is preferably dry etching.

In addition, step (d) preferably comprises etching the substrate and the insulating layer using a mask having an etching pattern with rounded corners so as to form an air gap having rounded corners.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE PREFERRED EMBODIMENTS

Figure 1A:
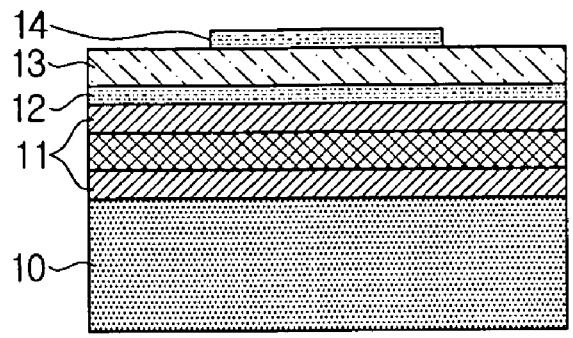
FIG. 1A is a cross sectional view showing a conventional bragg reflector typed FBAR.
Figure 1B:
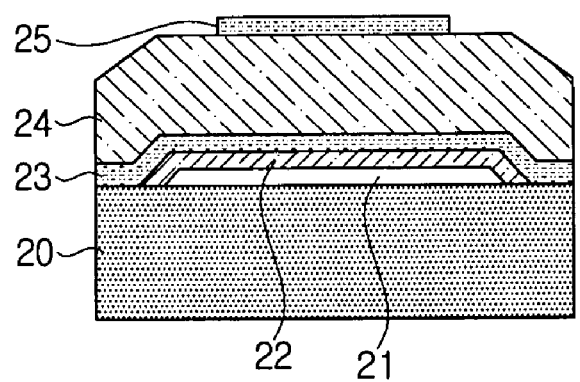
FIG. 1B is a cross sectional view showing an air gap type FBAR made by a conventional method.

The present invention will next be described in greater detail with reference to the accompanying drawings. However, the present invention should not be construed as being limited thereto.

In the following description, the same drawing reference numerals are used to identify the same elements in different drawings. The following detailed description of construction and elements is provided to assist in a comprehensive understanding of the invention. Thus, it is apparent that the present invention can be carried out by various means without being limited to specific embodiments. Also, well-known functions or constructions are not described in detail since they would obscure the invention in unnecessary detail.

Figure 2:
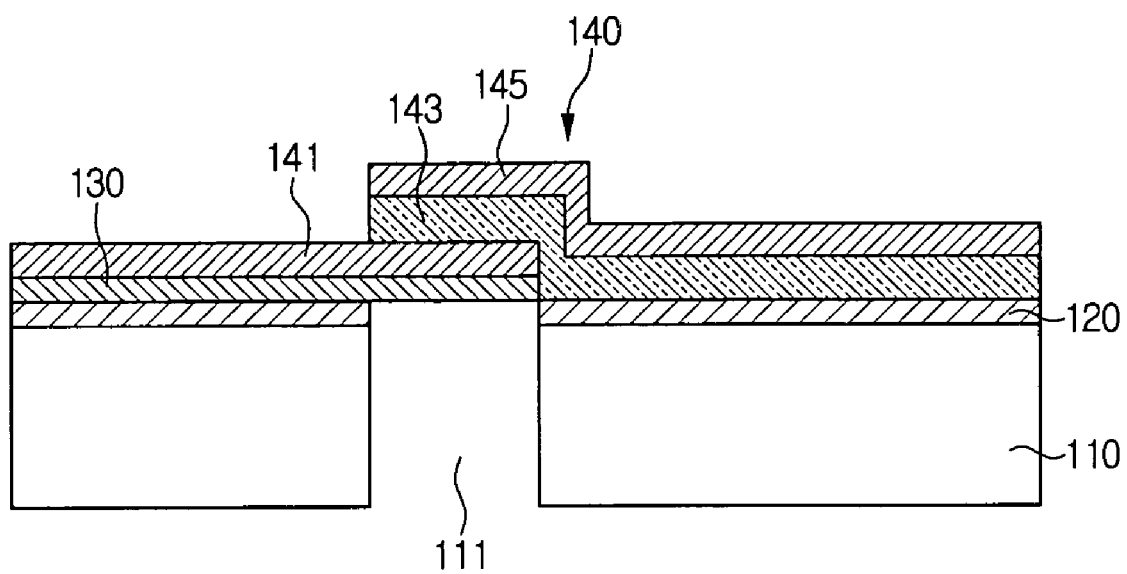
FIG. 2 is a cross sectional diagram showing an FBAR according to an embodiment of the present invention.

FIG. 2 is a cross sectional diagram showing a Film Bulk Acoustic Resonator (hereinafter "FBAR") according to an embodiment of the present invention.

Referring to FIG. 2, the FBAR of the present invention comprises a substrate 110 with an air gap 111, an insulating layer 120, an etching resistance layer 130 and a resonance part 140. For the substrate 110, a regular silicon substrate may be used. An insulating layer 120 is formed on the substrate 110. The insulating layer 120 electrically separates the etching resistance layer 130 and the resonance part 140 from the substrate 110. Silica ($SiO_2$) or aluminum oxide ($Al_2O_3$) can be used as the insulating layer. This insulating layer 120 may be deposited on the substrate 110 using an RF magnetron sputtering method or other deposition method known to those skilled in the art.

In addition, air gap 11 is formed in the substrate 110. The air gap 111 is etched through the substrate 110 and the insulating film 120, exposing the etching resistance layer 130. The air gap 11 is formed at a lower part corresponding to and aligned under the resonance part 140. In addition, the air gap 111 may be formed by a dry etching method.

The etching resistance layer 130 is deposited in a predetermined width on the insulating layer 120 to be positioned at least over the air gap 111. The etching resistance layer 130 is preferably made of a substance having a relatively high etching selectivity (i.e., high etching resistance) compared to the substrate 110, for example, compared to silicon. More preferably, the etching resistance layer 130 is made of a substance having an etching selectivity of 3000 or more compared to silicon. Accordingly, in the etching process for forming the air gap 111, the etching depth is limited by the etching resistance layer 130, thereby preventing damage to the resonance part 140. As an example of a substance having a high etching selectivity, the etching resistance layer 130 is preferably formed from a metal substance such as Cr which is electrically connectable to the first electrode 141 (described below).

The resonance part 140 comprises a first electrode 141, a piezoelectric film 143 and the second electrode 145 which are laminated, in order, so as to be positioned over the air gap 111.

The resonance part 140 is adapted for filtering radio signals by making use of the piezoelectric effect of the piezoelectric film 143. In other words, a radio frequency signal applied to the second electrode 145 can be outputted toward the first electrode 141 through the resonance part 140. The resonance part 140 has a uniform frequency resulting from a vibration generated in the piezoelectric film 143, such that only a signal corresponding to the resonance frequency of the resonance part 140, among the inputted RF signals, is outputted.

The first electrode 141 is formed on the etching resistance 130, and the piezoelectric film 143 is formed to cover the insulating layer 120 and an upper surface of the first electrode 143, such that the resonance part 140 is supported on the upper part of the air gap 111.

The first and the second electrodes 141, 145 are formed from an ordinary conductive material such as a metal. Specifically, for the first and second electrodes 141, 145, aluminum Al, tungsten W, gold Au, platinum Pt, nickel Ni, titanium Ti, chrome Cr, palladium Pd, molybdenum Mo, etc., may be used.

In addition, as described above, the piezoelectric film 143 generates a piezoelectric effect of transforming electrical energy into mechanical energy in elastic wave form. The piezoelectric substance of the piezoelectric film 143 may comprise aluminum nitride AlN, flowers of zinc ZnO, etc.

In the FBAR embodiment of the present invention having the above structure, the etching resistance layer 130 is made of a metal, preferably chrome Cr having a high etching selectivity, like the first electrode 141. Accordingly, the etching resistance layer 130 and the first electrode 141 can together form the lower electrode of the resonance part 140. In addition, since the etching resistance layer 130 functions as a component of the resonance part 140, the resonance part 140 can be formed without increasing its whole thickness or without decreasing the thickness of the piezoelectric film 143 made of AlN, thereby improving the resonance characteristics of the device. In addition, in forming the air gap 111, the present invention can prevent the resonance part 140 from being damaged in the etching process. In addition, the present embodiment uses chrome as the etching resistance layer 130, thereby minimizing notch generation at a corner in forming the air gap 111.

Figure 3A:
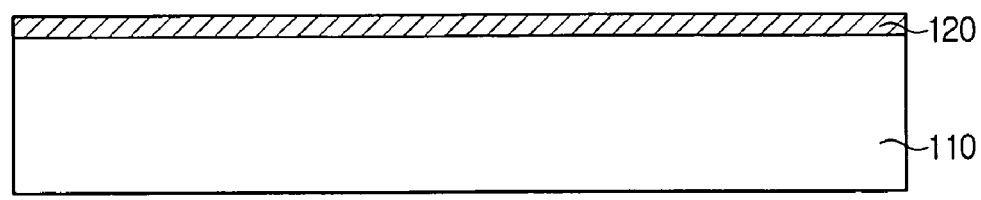
FIG. 3A to 3C are cross sectional diagrams showing a process for manufacturing the FBAR of FIG. 2.
Figure 3B:
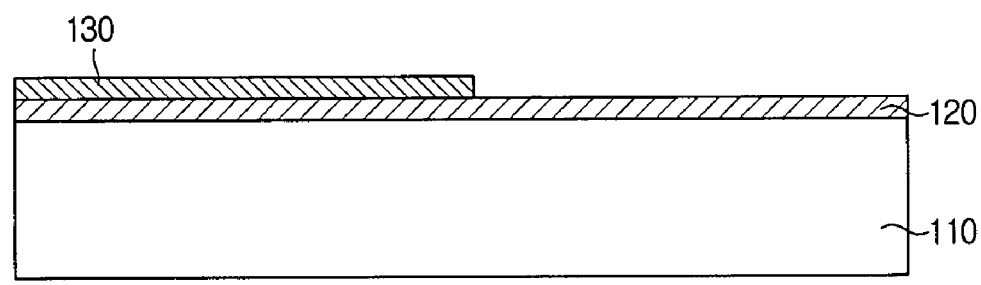
Figure 3C:
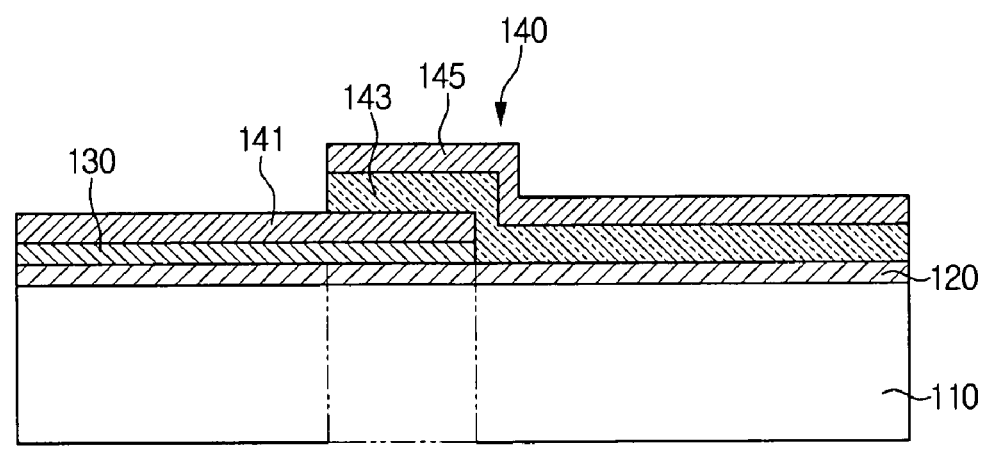

FIGS. 3A to 3C, illustrate steps for manufacturing the FBAR of FIG. 2.

First, as shown in FIG. 3A, an insulating layer 120 is deposited on the entire surface of the substrate 110. The material of the insulating layer 120 and a method for depositing the same are as described above, so that its detailed description is now omitted.

Next, as shown in FIG. 3B, an etching resistance layer 130 is deposited on a predetermined area of the insulating layer 120. For example, metal, preferably chrome, is first deposited on the entire surface of the insulating layer 120 and is then patterned to expose a predetermined area of the insulating area 120. The patterning may be carried out using a photoresist film, where only those areas not protected by the photoresist film (for example, those areas exposed through a mask and developed to remove photoresist at the exposed portions) are etched to form a predetermined pattern.

Next, as shown in FIG. 3C, on the exposed insulating layer 120 and the etching resistance layer 130, the first electrode 141, the insulating film 143 and the second electrode 145 are laminated, in turn, to form the resonance part 140.

For example, the first electrode 141 is first deposited on the entire surface of the exposed insulating layer 120 and the etching resistance layer 130, and is then patterned to expose a certain area of the insulating layer 120.

Next, the piezoelectric layer is deposited on the entire surface of the exposed insulating layer 120 and the first electrode 141, and is then patterned to expose a certain area of the first electrode 141.

In the next step, the second electrode 145 is deposited on the entire surface of the exposed first electrode 141 and the piezoelectric layer 143, and is then patterned to expose the first electrode 141, thereby laminating the second electrode 145 on a predetermined area of the piezoelectric layer 143.

Lastly, a lower part of the substrate 110 is etched using a dry etching method and then the area shown by a virtual line in FIG. 3C is removed, to form the air gap of FIG. 2. As the dry etching method, a reactive ion etching (RIE) method may be used. In the RIE method, a reactive gas is activated in a plasma state. This causes a chemical reaction of the gas with the substance to be etched, to thereby volatilize and etch the substance. Specially, a reactive ion etching method using an inductive coupled plasma (ICP) as an activation source may be used (hereinafter this method is called "ICP-RIE"). The $SF_6$ and Ar may be used in etching the lower part of the substrate 110 in the ICP-RIE. The $C_4F_8$ may be additionally used to enlarge a slope of etched cross-section. Preferably, a power and a pressured used in the ICP-RIE is controller in the range of from 500 to 1500 W and from 20 to 30 mTorr, respectively. The ICP-RIE dry etching method exhibits no etching anisotropy, and has an advantage of considerably increasing the degrees of freedom of shape as compared to a wet etching method.

As described above, when the air gap 111 is formed by using the dry etching method, even the insulating layer 120 is removed, and the etching process continues until the etching resistance layer 130 is exposed. Accordingly, the air gap 111 can be formed with a desirable shape and depth, while also preventing damage to the resonance part 140 by providing the etching resistance layer 130.

Using the above method, the FBAR of FIG. 2 is completed. The manufactured FBAR filters only RF signals having a predetermined frequency band. Accordingly, when a plurality of FBARs are combined in a series and parallel arrangement, a band pass filter having a uniform central frequency and frequency bandwidth can be achieved. In addition, the band pass filter can be combined with a phase shifter consisting of a combination of inductors and capacitors, thereby making a duplexer.

Figure 4:
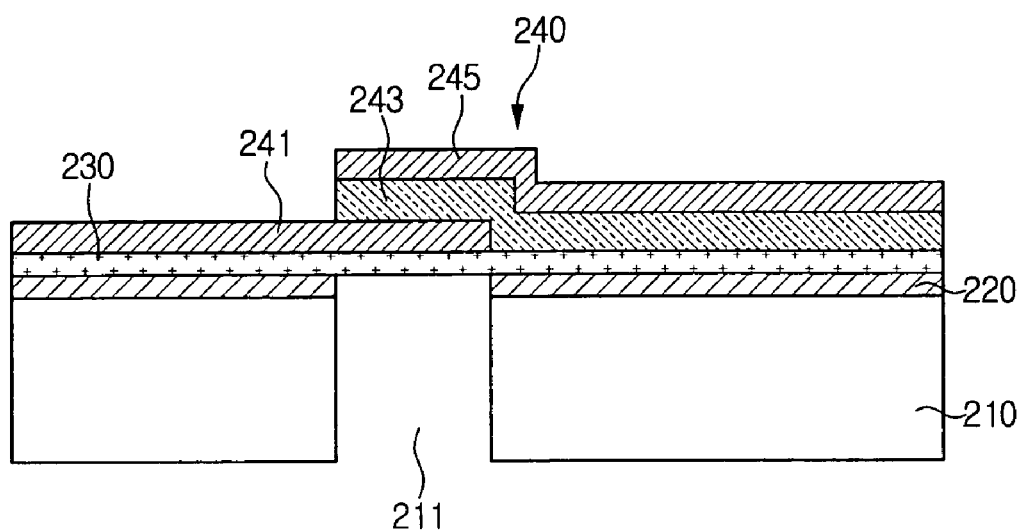
FIG. 4 is a cross sectional view showing an FBAR according to another embodiment of the present invention.

FIG. 4 is a view of showing an FBAR according to another embodiment of the present invention. Referring to FIG. 4, an insulating layer 220 is deposited on the substrate 210, and an air gap 211 is formed which exposes the etching resistance layer 230 through the substrate 210 and the insulating layer 220. The etching resistance layer 230 is deposited on the entire surface of the insulating layer 220. The etching resistance layer 230 limits the etching depth when etching a bottom of the substrate 210 in a subsequent step.

On the etching resistance layer 230, a resonance part 240 is formed at a position corresponding to the air gap 211. The resonance part 240 functions in the same manner as the resonance part 140 in FIG. 2, and comprises a first electrode 241, a piezoelectric film 243 and the second electrode 245 which are laminated in turn.

The first and second electrodes 241, 245 are conductive, and a detailed description thereof is omitted as these electrodes are made of the same substance as the first and second electrodes 141, 145 of FIG. 2.

The piezoelectric film 243 functions in the same manner as the piezoelectric film 243 of FIG. 2. In this embodiment, the piezoelectric film 243 is formed on a predetermined area of the first electrode 241 and the etching resistance layer 230. Accordingly, the piezoelectric film 243 and the etching resistance layer 230 are preferably formed of the same material so as to improve the affinity and the crystal characteristic between one another, and therefore preferably formed of an aluminum nitride AlN. When the etching resistance layer 230 is made of aluminum nitride AlN as above, the layer functions to electrically separate the first electrode 241 from other parts. Consequently, it is not necessary to pattern etching resistance layer 230 after depositing it on the entire surface of the insulating layer 230. In addition, because the etching resistance layer 230 is made of the same material as the piezoelectric film 243, the etching resistance layer 230 has a piezoelectric as well as an etching depth control function, so as to contribute to the resonance function of the resonance part 240. Accordingly, the etching resistance layer 243 can be included as part of the entire depth of the resonance part 240. Thus, an additional membrane is not necessary to support the resonance part, thereby improving its resonance characteristic.

A method of manufacturing an FBAR according to the embodiment having the above structure will next be described in detail with reference to FIG. 5A to FIG. 5C.

Figure 5A:
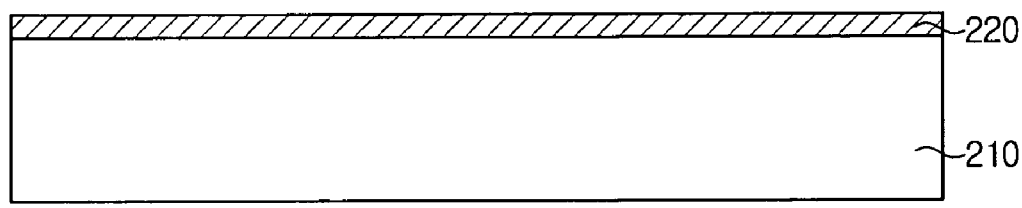
FIG. 5A to 5C are cross sectional views showing a method for manufacturing the FBAR of FIG. 4.

First, as shown in FIG. 5A, an insulating layer 220 is deposited on the entire surface of the substrate 210.

Figure 5B:
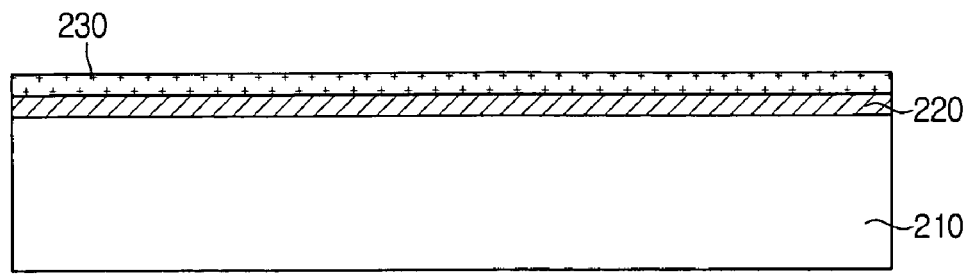

In the next step, as shown in FIG. 5B, an etching resistance layer 230 is deposited on the entire surface of the insulating layer 220. The etching resistance layer 230 is deposited using a serial deposition method, and is made of an aluminum nitride AlN.

Figure 5C:
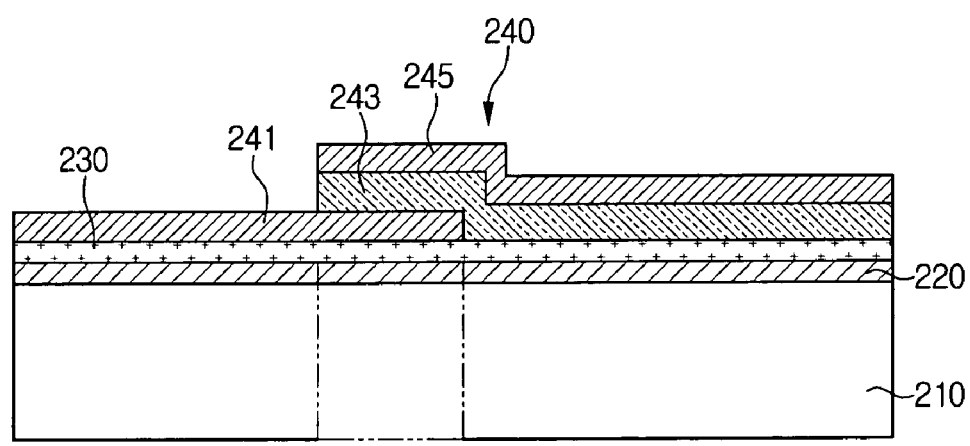

Next, as shown in FIG. 5C, the first electrode 241, the piezoelectric film 243 and the second electrode 245 are deposited in turn on a predetermined area of the etching resistance layer 230 to form the resonance part 240.

Specifically, the first electrode 241 is deposited on the entire surface of the etching resistance layer 230, and is then patterned to expose a certain area of the etching resistance layer 230.

Next, a piezoelectric film 243 is deposited on the entire surface of the first electrode 241 and on the exposed etching resistance layer 230, and is then patterned to expose a part of the area of the first electrode and to allow the piezoelectric film 243 to remain on a certain area. When the piezoelectric film 243 is deposited to cover the etching resistance layer 230, the film is made of the same material as the etching resistance layer 230.

Next, a second electrode 245 is deposited on the entire surface of the piezoelectric film 243 and on the exposed first electrode 241, and is then patterned to allow the second electrode 245 to remain on a certain area. After the resonance part 240 is formed by this method, a lower part of the substrate 210 is etched to a certain depth by a dry etching method to form the air gap 211 as shown in FIG. 4. In other words, as shown in FIG. 5C, a certain area (area shown by a virtual line) is etched until the etching resistance layer 230 is exposed to form the air gap 211 in a certain depth and shape. In this manner, by forming the air gap 211 using a dry etching method, the present invention provides an etching resistance layer 230 under the resonance part 240, thereby easily forming the air gap 211 without chemically or mechanically damaging the resonance part 240.

Figure 6:
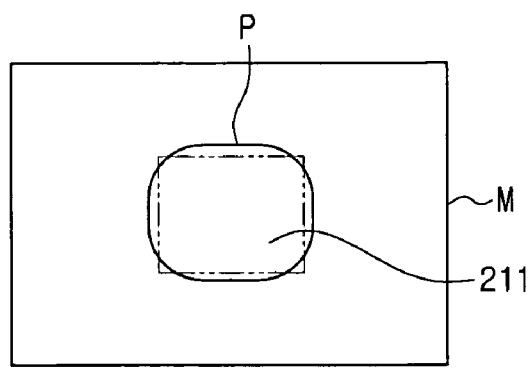
FIG. 6 is a top view of a mask M including a pattern P having rounded corners and an underlying air gap.

In addition, as shown in FIG. 6, the pattern P of a mask M used for forming the air gap 211 has rounded corners so as to make corresponding corners of the air gap round, thereby preventing the generation of notches.

In an FBAR according to another embodiment of the present invention, the etching resistance layer 230 is only deposited on the insulating layer 220 and its patterning process may be omitted, thereby manufacturing the FBAR by a simple method. In addition, the etching resistance layer 230 can be made of the same material as the piezoelectric film 243, thereby improving its affinity and crystal matching characteristic with the piezoelectric film 243.

As described above, according to the present invention, the etching resistance layer is formed under the resonance part, to thereby prevent damage to the resonance part in forming the air gap by means of an etching process.

In addition, when forming the etching resistance layer of a metal like that of the first electrode, the etching resistance layer can function as the first electrode, thereby preventing the entire depth of the air gap from becoming too large.

In addition, in another preferred embodiment of the present invention, the etching resistance layer is made of the same material as the piezoelectric film, to thereby improve its combination (crystal lattice matching) characteristic and affinity to the piezoelectric film. Also, the etching resistance layer can be included in the resonance part, thereby preventing an entire depth of the air gap from becoming too large and improving a resonance characteristic of the resonance part.

The foregoing embodiment and advantages are merely exemplary and are not to be construed as limiting the present invention. The present teachings can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A film bulk acoustic resonator (FBAR), comprising:
   a substrate having an etched air gap therethrough;
   a resonance part having a first electrode, a piezoelectric film and a second electrode which are laminated in turn above the air gap;
   an etching resistance layer disposed between the air gap and the resonance part so as to limit an etching depth in forming the air gap, thereby preventing damage to the resonance part; and
   an insulating layer laminated between the substrate and the etching resistance layer,
   wherein the insulating layer is absent above the air gap, and the etching resistance layer is made of a material that is different from a material of the first electrode.

2. The FBAR as claimed in claim 1, wherein the etching resistance layer is made of a metal material having a high etching selectivity relative to the substrate.

3. The FBAR as claimed in claim 1, wherein the etching resistance layer is made of chrome.

4. The FBAR as claimed in claim 3, wherein the etching resistance layer is laminated between the first electrode and the insulating layer.

5. The FBAR as claimed in claim 1, wherein the etching resistance layer is laminated between the first electrode and the insulating layer.

6. The FBAR as claimed in claim 1, wherein the etching resistance layer is made of a dielectric material.

7. The FBAR as claimed in claim 6, wherein the etching resistance layer is made of an aluminum nitride AlN.

8. The FBAR as claimed in claim 7, wherein the etching resistance layer contacts the piezoelectric film.

9. The FBAR as claimed in claim 6, wherein the etching resistance layer contacts the piezoelectric film.

10. A method of manufacturing an FBAR, which comprises:
    (a) depositing an insulating layer on a substrate;
    (b) laminating an etching resistance film on the insulating layer;
    (c) laminating in turn a first electrode, a piezoelectric film and a second electrode on the etching resistance film and/or the insulating layer to make a resonance part; and
    (d) etching a portion of the substrate and the insulating layer to form an air gap below the resonance part.

11. The method as claimed in claim 10, wherein step (b) includes depositing a metal material on the insulating layer; and forming the etching resistance film on a part of the insulating layer by patterning the metal material so as to expose a portion of the insulating layer.

12. The method as claimed in claim 11, wherein the etching resistance film is made of chrome Cr.

13. The method as claimed in claim 11, wherein step (c) includes a step of laminating the first electrode on the patterned etching resistance film; laminating the piezoelectric film on the first electrode and the exposed insulating film; and laminating the second electrode on the piezoelectric film.

14. The method as claimed in claim 10, wherein step (d) comprises etching the substrate and insulating layer from a lower part of the substrate to the etching resistance film in an area below the resonance part to form said air gap.

15. The method as claimed in claim 14, wherein the etching step (d) comprises dry etching.

16. The method as claimed in claim 10, wherein step (d) comprises etching the substrate and the insulating layer using a mask having an etching pattern with rounded corners so as to form an air gap having rounded corners.

17. The method as claimed in claim 10, wherein the step (c) includes a step of laminating the first electrode to cover a part of the etching resistance film so as to leave exposed etching resistance film; laminating the piezoelectric film on the exposed etching resistance film and the first electrode; and laminating the second electrode on the piezoelectric film.

18. The manufacturing method as claimed in claim 17, wherein step (d) comprises etching the substrate and insulating layer from a lower part of the substrate to the etching resistance film in an area below the resonance part to form said air gap.

19. The method as claimed in claim 10, wherein the etching resistance film is made of a dielectric material.

20. The method as claimed in claim 19, wherein the etching resistance film is made of an aluminum nitride AlN.

* * * * *